United States Patent
Tsai

(10) Patent No.: US 11,109,172 B2
(45) Date of Patent: Aug. 31, 2021

(54) AUDIO PROCESSING CIRCUIT SUPPORTING MULTI-CHANNEL AUDIO INPUT FUNCTION

(71) Applicant: Realtek Semiconductor Corp., Hsinchu (TW)

(72) Inventor: Chiu-Yun Tsai, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/872,414

(22) Filed: May 12, 2020

(65) Prior Publication Data
US 2020/0374643 A1 Nov. 26, 2020

(30) Foreign Application Priority Data
May 21, 2019 (TW) ................................ 108117539

(51) Int. Cl.
*H04S 3/00* (2006.01)
*H03M 1/12* (2006.01)

(52) U.S. Cl.
CPC ........... *H04S 3/006* (2013.01); *H03M 1/1205* (2013.01); *H04S 2400/01* (2013.01)

(58) Field of Classification Search
CPC .. H04S 3/006; H04S 2400/01; H03M 1/1205; H03M 1/121
See application file for complete search history.

(56) References Cited

U.S. PATENT DOCUMENTS

| | | | | |
|---|---|---|---|---|
| 6,657,574 B1* | 12/2003 | Rhode | ................ | H03M 1/1205 341/141 |
| 6,804,504 B1* | 10/2004 | Johnson | ................ | H04H 60/04 381/394 |
| 7,119,730 B2* | 10/2006 | San | ................ | H03K 19/17732 341/163 |
| 8,732,435 B1* | 5/2014 | Chou | ................ | G06F 9/3455 711/217 |
| 8,922,411 B2* | 12/2014 | Ullmann | ............... | H03M 1/004 341/143 |
| 2003/0069717 A1* | 4/2003 | Havelock | ................ | H01Q 3/24 702/191 |

(Continued)

FOREIGN PATENT DOCUMENTS

GB 2553473 A 7/2018

*Primary Examiner* — David L Ton
(74) *Attorney, Agent, or Firm* — McClure, Qualey & Rodack, LLP

(57) ABSTRACT

An circuit includes: a plurality of analog-to-digital converters (ADCs) and a control chip. The control chip is utilized for instructing a target ADC to output audio data of a target channel during a target period, and utilized for instructing remaining ADCs not to output audio data in the target period. Then, the control chip defines data timing of the target channel and other channels based on the data receiving time point of the audio data of the target channel. The plurality of ADCs would process analog audio signals of a plurality of channels and output audio data of the plurality of channels according to an assigned order configured by the control chip to form a serial data signal. The control chip separates the audio data of different channels from the serial data signal according to the data timing of the plurality of channels.

9 Claims, 8 Drawing Sheets

(56) References Cited

U.S. PATENT DOCUMENTS

2004/0015252 A1\* 1/2004 Aiso .................... G11B 27/031
　　　　　　　　　　　　　　　　　　700/94
2004/0034499 A1\* 2/2004 Regier ................. H03M 1/145
　　　　　　　　　　　　　　　　　　702/127

\* cited by examiner

AUDIO PROCESSING CIRCUIT SUPPORTING MULTI-CHANNEL AUDIO INPUT FUNCTION

CROSS-REFERENCE TO RELATED APPLICATIONS

This application claims the benefit of priority to patent application Ser. No. 108117539, filed in Taiwan on May 21, 2019; the entirety of which is incorporated herein by reference for all purposes.

BACKGROUND

The disclosure generally relates to an audio processing circuit and, more particularly, to an audio processing circuit supporting multi-channel audio input function.

There are more and more electronic devices requiring multi-channel input function support, such as smart speakers, voice controllers of smart televisions, voice-control robots, vehicle voice-control systems, or the like. In these electronic devices, the audio processing circuit typically utilizes control chips having a time division multiplexed (TDM) interface (hereinafter referred to as TDM interface) or a multi-channel inter-IC sound interface (hereinafter referred to as multi-channel I2S interface) to process multi-channel audio data.

However, the multi-channel I2S interface requires more signal pins, and thus control chips related thereto would require greater package size and higher manufacturing cost. Furthermore, since a TDM interface standard that is universal has yet to exist in the industry, the overall circuit design may become complicated when such a control chip is used in cooperation with other circuits via a TDM interface that is nonuniversal.

SUMMARY

An example embodiment of a circuit is disclosed, comprising: a plurality of analog-to-digital converters (ADC), configured to operably convert analog audio signals of a plurality of channels into corresponding digital audio data, wherein the plurality of ADCs comprise a target ADC utilized for processing an analog audio signal of a target channel in the plurality of channels; and a control chip, coupled with the plurality of ADCs, and configured to operably control an audio data output order of the plurality of ADCs, to operably instruct the target ADC to output an audio data of the target channel during a target period, and to operably instruct remaining ADCs of the plurality of ADCs not to output audio data in the target period; wherein the control chip is further configured to operably define a data timing of the target channel according to a data receiving time point of the audio data of the target channel, and then to operably define a data timing of remaining channels of the plurality of channels according to the data timing of the target channel; after the control chip defines the data timing of the plurality of channels, the plurality of ADCs process the analog audio signals of the plurality of channels and output the audio data of the plurality of channels in turns according to an assigned order configured by the control chip to form a serial data signal, and the control chip separates the digital audio data of different channels from the serial data signal according to the data timing of the plurality of channels.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
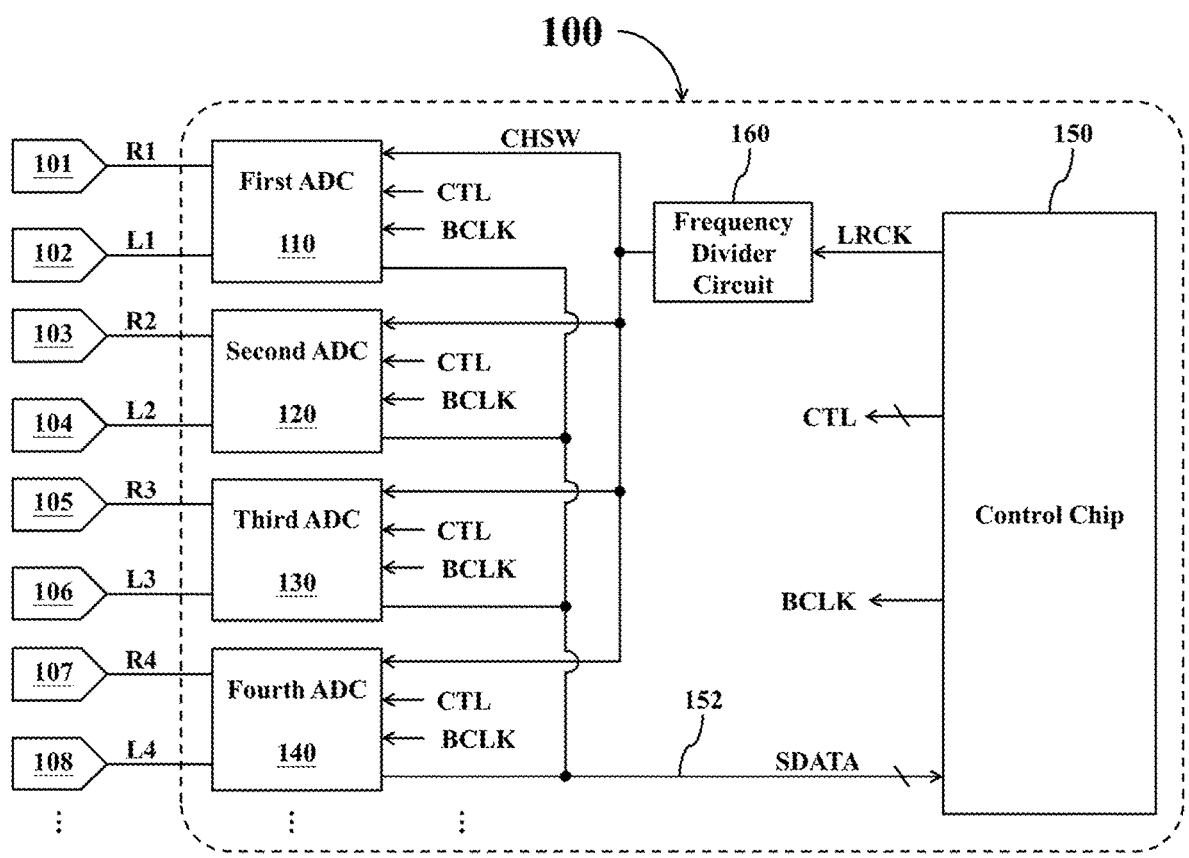
FIG. 1 shows a simplified functional block diagram of an audio processing circuit according to one embodiment of the present disclosure.

FIG. 1 shows a simplified functional block diagram of an audio processing circuit 100 according to one embodiment of the present disclosure. The audio processing circuit 100 comprises a plurality of analog-to-digital converters (ADC), for example, the exemplary ADCs 110~140 shown in FIG. 1. In addition, the audio processing circuit 100 further comprises a control chip 150 and a frequency divider circuit 160.

The ADCs 110~140 are configured to respectively convert analog audio signals of a plurality of audio channels into a plurality of corresponding digital audio data.

In this embodiment, for example, the ADC 110 is utilized for respectively converting the first right-channel stereo signal R1 of the first right-channel 101 and the first left-channel stereo signal L1 of the first left-channel 102 into a corresponding first right-channel digital data DR1 and a first left-channel digital data DL1. The ADC 120 is utilized for respectively converting the second right-channel stereo signal R2 of the second right-channel 103 and the second left-channel stereo signal L2 of the second left-channel 104 into a corresponding second right-channel digital data DR2 and a second left-channel digital data DL2. The ADC 130 is utilized for respectively converting the third right-channel stereo signal R3 of the third right-channel 105 and the third left-channel stereo signal L3 of the third left-channel 106 into a corresponding third right-channel digital data DR3 and a third left-channel digital data DL3. The ADC 140 is utilized for respectively converting the fourth right-channel stereo signal R4 of the fourth right-channel 107 and the fourth left-channel stereo signal L4 of the fourth left-channel 108 into a corresponding fourth right-channel digital data DR4 and a fourth left-channel digital data DL4.

In other words, the combination of the ADCs 110~140 are capable of processing the analog audio signals of 8 different channels, thus the audio processing circuit 100 is enabled to support the audio equipment that requires 8 channels input function.

The control chip 150 is coupled with the ADCs 110~140, and configured to operably generate and transmit a control signal CTL and a bit clock signal BCLK to each of the ADCs 110~140 so as to control the audio sampling timing and the data output order of the ADCs 110~140. As shown in FIG. 1, the control chip 150 receives the digital audio data outputted from the ADCs 110~140 through a serial data line 152. In addition, the control chip 150 further generates and transmits a left-right clock signal LRCK to the frequency divider circuit 160.

The frequency divider circuit 160 is coupled between the control chip 150 and each of the ADCs 110~140, and configured to operably perform a frequency dividing operation on the left-right clock signal LRCK so as to generate a channel switch signal CHSW, wherein the frequency of the channel switch signal CHSW is 1/N of the frequency of the left-right clock signal LRCK. In this embodiment, N is equal to a total quantity of the ADCs in the plurality of ADCs 110~140. Since the aforementioned ADCs 110~140 has four ADCs, thus the frequency of the channel switch signal CHSW is a quarter of the frequency of the left-right clock signal LRCK in this embodiment.

In operations, the ADCs 110~140 sample the analog audio signals R1~R4 and L1~L4 of the aforementioned 8 channels according to the bit clock signal BCLK to generate corresponding digital audio data DR1~DR4 and DL1~DL4. Each ADC switches the channel from which the digital audio data is to be outputted according to the channel switch signal CHSW. In addition, the ADCs 110~140 output data in turns according to an assigned order configured by the control signal CTL, so that the periods during which an ADC outputs data do not overlap with one another.

In practice, the aforementioned channels 101~108 may correspond to the signal output paths of various acoustic sensors (e.g., a microphone array, or the like). Each of the aforementioned ADCs 110~140 may be realized with various existing appropriate two-channel analog-to-digital converting circuits supporting TDM output format. The frequency divider circuit 160 may be realized with various existing integer frequency divider structures.

Figure 2:
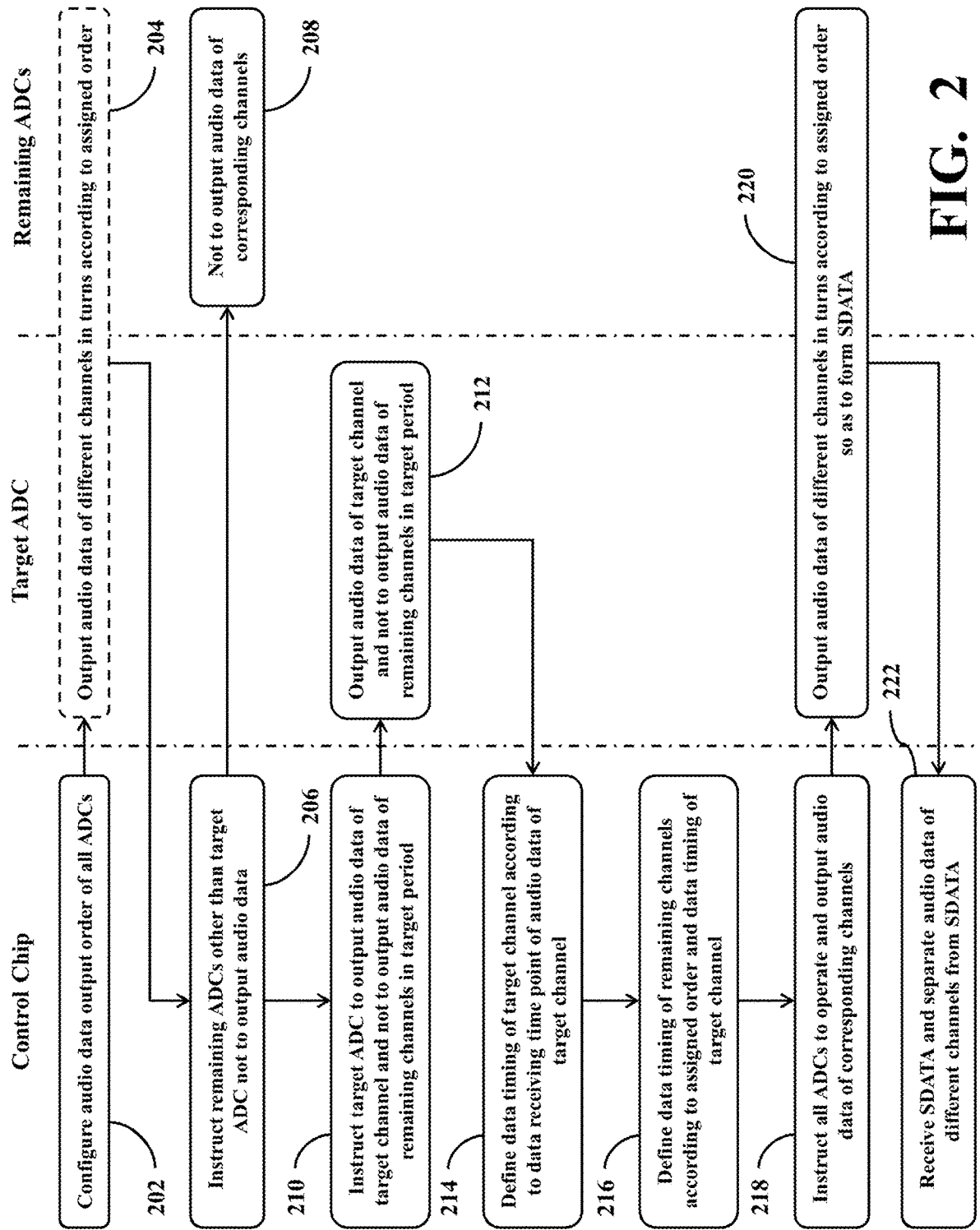
FIG. 2 shows a simplified flowchart of a multi-channel audio data separating method according to a first embodiment of the present disclosure.

The operations of the audio processing circuit 100 would be further described below with reference to FIG. 2. FIG. 2 shows a simplified flowchart of a multi-channel audio data separating method according to a first embodiment of the present disclosure.

In the flowchart of FIG. 2, operations within a column under the name of a specific device are operations to be performed by the specific device. For example, operations within a column under the label "control chip" are operations to be performed by the control chip 150; operations within a column under the label "target ADC" are operations to be performed by one of the ADCs 110~140; operations within a column under the label "remaining ADCs" are operations to be performed by other ADCs in the ADCs 110~140 except the target ADC; and so forth. The same analogous arrangement also applies to the subsequent flowcharts.

The control chip 150 may perform the operation 202 at each time the audio processing circuit 100 is turned on to instruct the ADCs 110~140 to start to operate, and utilize the control signal CTL to configure the audio data output order of all of the ADCs 110~140.

Then, the ADCs 110~140 perform the operation 204 to respectively convert the aforementioned analog audio signals R1~R4 and L1~L4 of audio channels 101~108 into the corresponding digital audio data DR1~DR4 and DL1~DL4, and to output the audio data of different channels in turns according to the assigned order configured by the control chip 150.

In practice, the control chip 150 may utilize the control signal CTL to respectively configure a count value for each of the ADCs 110~140, so that different ADCs have different count values. The control chip 150 may also instruct the ADCs 110~140 to synchronically count the pulses of the bit clock signal BCLK. Each ADC may output data when the pulse count value reaches a corresponding count value configured by the control chip 150, and may reset the counting operation after the pulse count value reaches an appropriate count value.

Figure 3:
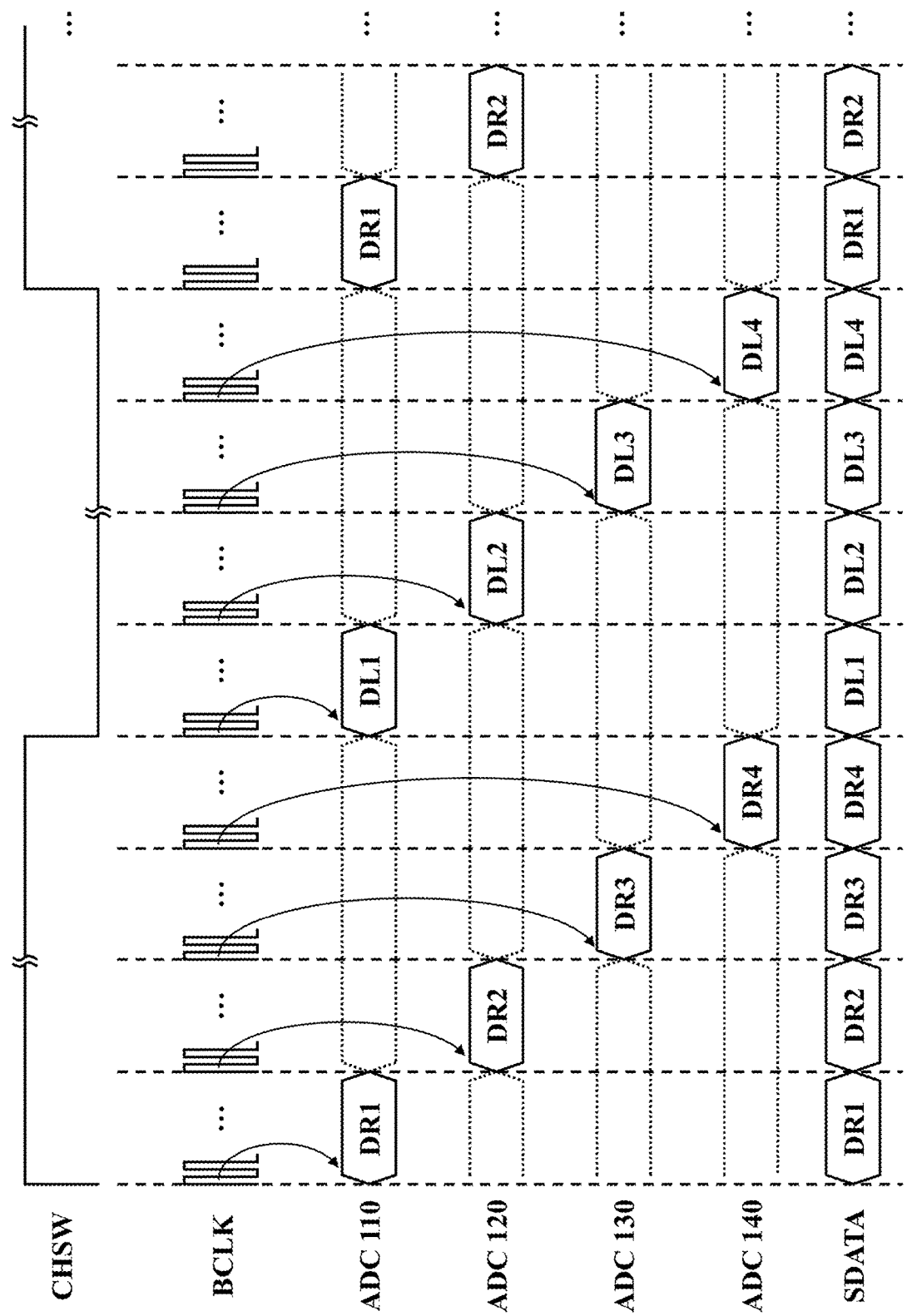
FIG. 3 shows a simplified data output timing diagram of a plurality of analog-to-digital converters in FIG. 1 according to one embodiment of the present disclosure.

For example, FIG. 3 shows a simplified data output timing diagram of the ADCs 110~140 according to one embodiment of the present disclosure.

The control chip 150 may utilize the control signal CTL to configure the ADC 110 to operably output data when the pulse count value reaches a first count value, to configure the ADC 120 to operably output data when the pulse count value reaches a second count value, to configure the ADC 130 to operably output data when the pulse count value reaches a third count value, to configure the ADC 140 to operably output data when the pulse count value reaches a fourth count value, and to configure the ADCs 110~140 to operably reset the count operation when the pulse count value reaches a fifth count value.

In addition, the control chip 150 may configure the second count value to be the sum of the first count value and a predetermined value, configure the third count value to be the sum of the second count value and the predetermined value, configure the fourth count value to be the sum of the third count value and the predetermined value, and configure the fifth count value to be the sum of the fourth count value and the predetermined value, so that the ADCs 110~140 respectively output data one time during every half duty cycle of the channel switch signal CHSW.

As a result, it renders the ADCs 110-140 to respectively output data in turns at different time points. The control chip 150 may further configure the aforementioned predetermined value to have an appropriate magnitude so that the periods during which respective ADCs 110~140 output data do not overlap with one another, i.e., each of the ADCs 110~140 would not output data during the period in which another ADC is outputting data.

In addition, as described previously, each ADC switches the channels via which the digital audio data is to be outputted according to the channel switch signal CHSW generated by the frequency divider circuit 160.

In the embodiment of FIG. 3, for example, when the pulse count value reaches the aforementioned first count value, if the channel switch signal CHSW is at a first logic level (e.g., the logic high level), the ADC 110 would output the digital audio data DR1 corresponding to the first right-channel 101; if the channel switch signal CHSW is at a second logic level (e.g., the logic low level), the ADC 110 would output the digital audio data DL1 corresponding to the first left-channel 102.

When the pulse count value reaches the aforementioned second count value, if the channel switch signal CHSW is at the first logic level, the ADC 120 would output the digital audio data DR2 corresponding to the second right-channel 103; if the channel switch signal CHSW is at the second logic level, the ADC 120 would output the digital audio data DL2 corresponding to the second left-channel 104.

When the pulse count value reaches the aforementioned third count value, if the channel switch signal CHSW is at the first logic level, the ADC 130 would output the digital audio data DR3 corresponding to the third right-channel 105; if the channel switch signal CHSW is at the second logic level, the ADC 130 would output the digital audio data DL3 corresponding to the third left-channel 106.

When the pulse count value reaches the aforementioned fourth count value, if the channel switch signal CHSW is at the first logic level, the ADC 140 would output the digital audio data DR4 corresponding to the fourth right-channel 107; if the channel switch signal CHSW is at the second logic level, the ADC 140 would output the digital audio data DL4 corresponding to the fourth left-channel 108.

As a result, during each duty cycle of the channel switch signal CHSW, each ADC outputs the digital audio data corresponding to the right-channel one time and outputs the digital audio data corresponding to the left-channel one time.

Therefore, in the embodiment of FIG. 3, the data output order of the ADCs 110~140 during each duty cycle of the channel switch signal CHSW is: the data DR1 of the first right-channel 101, the data DR2 of the second right-channel 103, the data DR3 of the third right-channel 105, the data DR4 of the fourth right-channel 107, the data DL1 of the first left-channel 102, the data DL2 of the second left-channel 104, the data DL3 of the third left-channel 106, and the data DL4 of the fourth left-channel 108.

Please note that the data output order shown in FIG. 3 is merely an exemplary embodiment, rather than a restriction to the practical implementations. In practice, during the period when the channel switch signal CHSW is at the first logic level, it is not limited that all of the ADCs 110~140 only can output the digital audio data corresponding to the right-channel.

Figure 4:
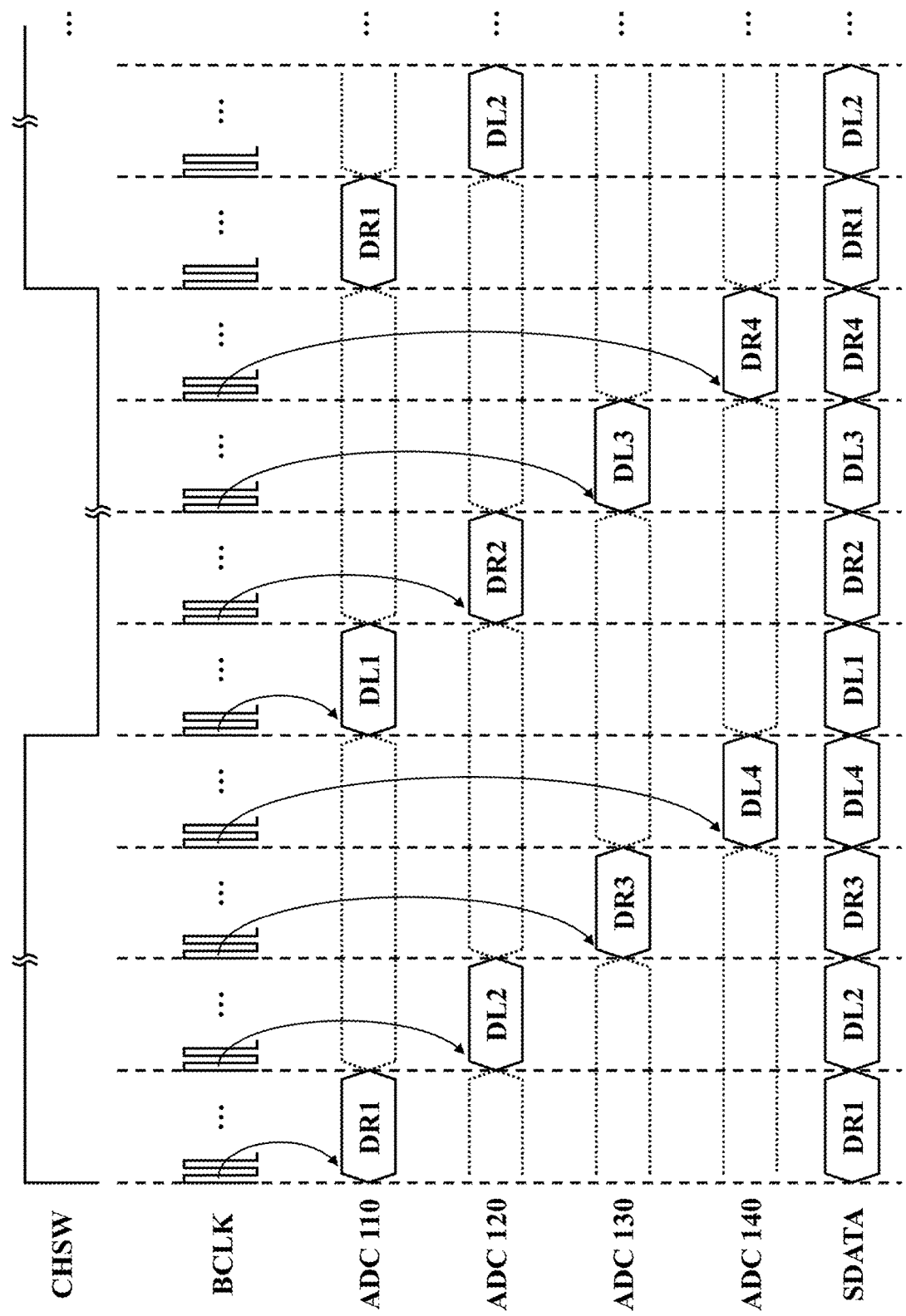
FIG. 4 shows a simplified data output timing diagram of the plurality of analog-to-digital converters in FIG. 1 according to another embodiment of the present disclosure.

For example, FIG. 4 shows a simplified data output timing diagram of the plurality of ADCs 110~140 according to another embodiment of the present disclosure. In the embodiment of FIG. 4, the data output order of the ADCs 110 and 130 is the same as the data output order in the aforementioned embodiment in FIG. 3, but data output order of the ADCs 120 and 140 is different from that in the aforementioned embodiment in FIG. 3.

In this embodiment, when the pulse count value reaches the aforementioned second count value, if the channel switch signal CHSW is at the aforementioned first logic level, the ADC 120 would output the digital audio data DL2 corresponding to the second left-channel 104; if the channel switch signal CHSW is at the second logic level, the ADC 120 would output the digital audio data DR2 corresponding to the second right-channel 103.

Similarly, when the pulse count value reaches the aforementioned fourth count value, if the channel switch signal CHSW is at the first logic level, the ADC 140 would output the digital audio data DL4 corresponding to the fourth left-channel 108; if the channel switch signal CHSW is at the second logic level, the ADC 140 would output the digital audio data DR4 corresponding to the fourth right-channel 107.

Therefore, in the embodiment of FIG. 4, the data output order of the ADCs 110~140 during each duty cycle of the channel switch signal CHSW is: the data DR1 of the first right-channel 101, the data DL2 of the second left-channel 104, the data DR3 of the third right-channel 105, the data DL4 of the fourth left-channel 108, the data DL1 of the first left-channel 102, the data DR2 of the second right-channel 103, the data DL3 of the third left-channel 106, and the data DR4 of the fourth right-channel 107.

By adopting the aforementioned data output order controlling approach as shown in FIG. 3 or FIG. 4, the ADCs 110~140 are enabled to output the digital audio data of different channels in turns according to the assigned order configured by the control chip 150, while ensuring that each of the ADCs 110~140 would not output data during the period in which another ADC is outputting data.

As can be appreciated from the aforementioned descriptions, the control chip 150 receives the digital audio data outputted from the ADCs 110~140 through the serial data line 152. In other words, the digital audio data generated by the ADCs 110~140 are transmitted to the control chip 150 in the form of the serial data signal SDATA through the serial data line 152.

In many applications, there is an inevitable timing delay during the process in which the ADCs 110~140 transmit the serial data signal SDATA to the control chip 150 through the serial data line 152. In addition, the serial data signal SDATA outputted from the ADCs 110~140 do not contain the identification data of relevant channels. Therefore, the audio processing circuit 100 would perform other operations in FIG. 2 so as to enable the control chip 150 to accurately determine the corresponding channels of the received audio data.

In operations, the control chip 150 may randomly select an ADC from the ADCs 110~140 to be a target ADC and select one of the channels handled by the target ADC to be a target channel, and then performs subsequent channel testing procedure. For the convenience of explanation, it is hereinafter assumed that the control chip 150 selects the ADC 110 to be the target ADC and selects the first right-channel 101 handled by the target ADC 110 to be the target channel.

In the embodiment of FIG. 2, for example, the control chip 150 performs the operations 206 and 210 at the same time.

In the operation 206, the control chip 150 may utilize the control signal CTL to instruct the remaining ADCs 120~140 (other than the target ADC 110) not to output audio data in the subsequent stage for a predetermined period of time (hereinafter referred to as target period). In this situation, the remaining ADCs 120~140 would not output audio data of any corresponding channels 103~108 to the serial data line 152 (operation 208) in the target period. The length of the aforementioned target period may be adjusted by the control chip 150 depending on the requirement of circuit operation.

In the operation 210, the control chip 150 may utilize the control signal CTL to instruct the target ADC 110 to output audio data of the target channel 101 and not to output audio data of remaining channels (e.g., the first left-channel 102 in this embodiment) in the target period. In this situation, the target ADC 110 would output the audio data DR1 corresponding to the target channel 101 to the serial data line 152 and not to output the audio data of the remaining channels (e.g., the digital audio data DL1 in this embodiment) to the serial data line 152 in the target period (operation 212).

In the aforementioned target period, the control chip 150 performs the operation 214 to receive the serial data signal SDATA through the serial data line 152. As can be appreciated from the aforementioned descriptions, only the audio data DR1 corresponding to the target channel 101 would be present in the serial data signal SDATA received by the control chip 150 in the target period, while the audio data corresponding to other channels would be absent in the serial data signal SDATA. Therefore, the control chip 150 may define the data timing of the target channel 101 in the operation 214 according to the data receiving time point of the audio data DR1.

After defining the data timing of the target channel 101, the control chip 150 may perform the operation 216 to define the data timing of the remaining channels 102~108 according to the aforementioned assigned order and the data timing of the target channel 101.

Figure 5:
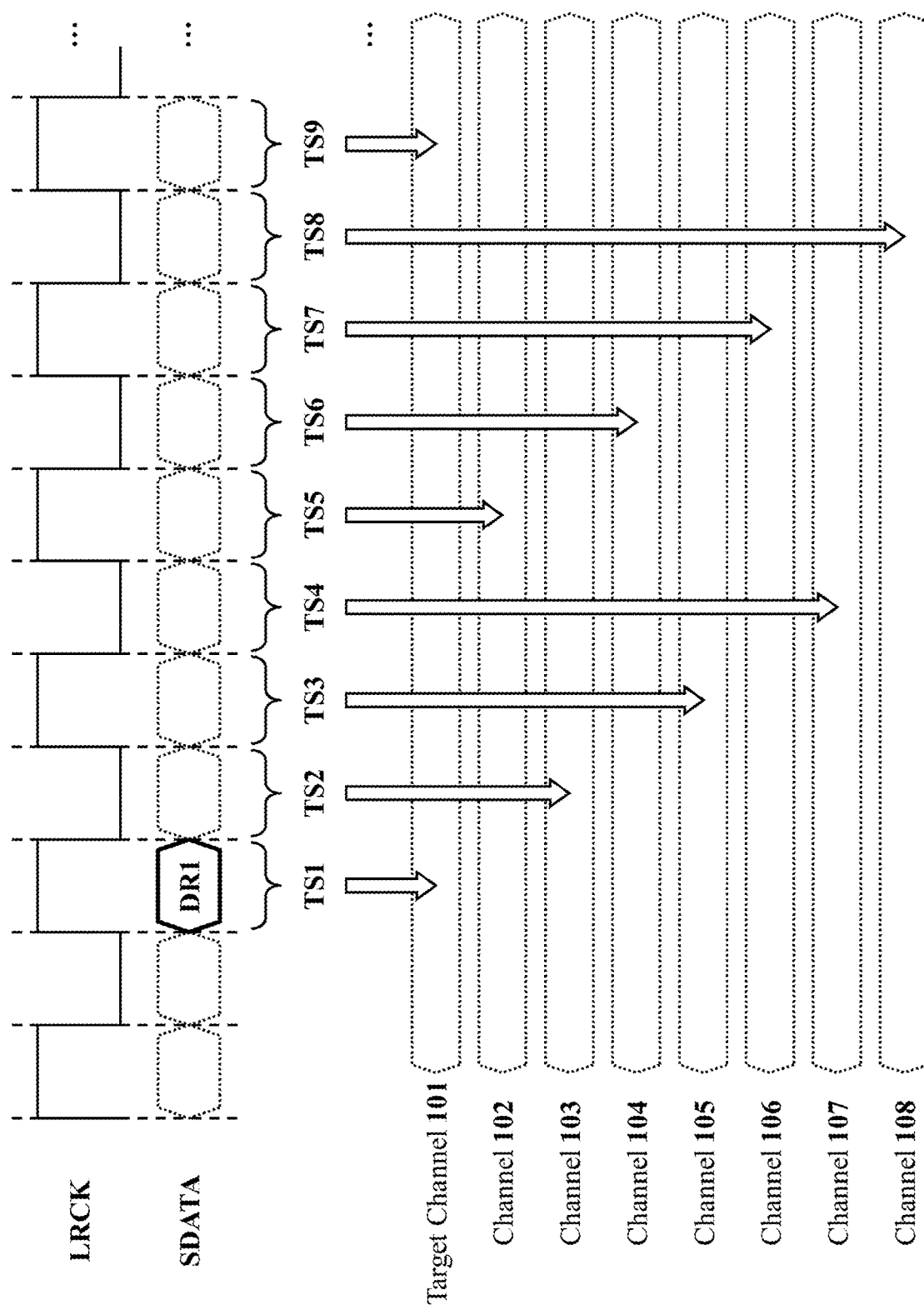
FIG. 5 shows a simplified data input timing diagram of a control chip in FIG. 1 according to one embodiment of the present disclosure.

For example, FIG. 5 shows a simplified data input timing diagram of the control chip 150 according to one embodiment of the present disclosure. As shown in FIG. 5, the control chip 150 receives the audio data DR1 of the target channel 101 in a period TS1. Therefore, the control chip 150 may establish the relation between the target channel 101 and the timing corresponding to the period TS1. For example, the control chip 150 may establish the relation between the target channel 101 and the pulse count value of the left-right clock signal LRCK corresponding to the initial time point of the period TS1 in the operation 214.

Since the data output order of the aforementioned ADCs 110~140 is the assigned order configured by the control chip 150, and that the length of data output period corresponding to each channel is also configured by the control chip 150, the control chip 150 may define the data timing of remaining channels 102~108 in the operation 216 according to the aforementioned assigned order and the data timing of the target channel 101.

For example, in the aforementioned embodiment of FIG. 3, the data output order of the ADCs 110~140 in each duty cycle of the channel switch signal CHSW is: the data DR1 of the first right-channel 101, the data DR2 of the second right-channel 103, the data DR3 of the third right-channel 105, the data DR4 of the fourth right-channel 107, the data DL1 of the first left-channel 102, the data DL2 of the second left-channel 104, the data DL3 of the third left-channel 106, and the data DL4 of the fourth left-channel 108. In this situation, the control chip 150 may infer that the arrangement order of channels corresponding to the periods TS2, TS3, TS4, TS5, TS6, TS7, and TS8 after the period TS1 is the same as the arrangement order of channels via which the data are outputted by the ADCs 110~140.

Therefore, as shown in FIG. 5, the control chip 150 determines that the period TS2 corresponds to the second right-channel 103, the period TS3 corresponds to the third right-channel 105, the period TS4 corresponds to the fourth right-channel 107, the period TS5 corresponds to the first left-channel 102, the period TS6 corresponds to the second left-channel 104, the period TS7 corresponds to the third left-channel 106, and the period TS8 corresponds to the fourth left-channel 108. In the operation 216, the control chip 150 may respectively establish the corresponding relationship between respective pulse count values of the left-right clock signal LRCK at respective initial time points of the aforementioned periods TS2-TS8 and the channels 102, 103, 104, 105, 106, 107, and 108. Applying the same analogy, the control chip 150 may determine that the arrangement order of the channels corresponding to the succeeding 8 periods after the period TS8 (i.e., the next 8 periods starting from the period TS9) is the same as the arrangement order of the channels corresponding to the aforementioned periods TS1-TS8.

For another example, in the aforementioned embodiment shown in FIG. 4, the data output order of the ADCs 110~140 in the each duty cycle of the channel switch signal CHSW is: the data DR1 of the first right-channel 101, the data DL2 of the second left-channel 104, the data DR3 of the third right-channel 105, the data DL4 of the fourth left-channel 108, the data DL1 of the first left-channel 102, the data DR2 of the second right-channel 103, the data DL3 of the third left-channel 106, and the data DR4 of the fourth right-channel 107. In this situation, the control chip 150 may infer that the arrangement order of the channels corresponding to the periods TS2, TS3, TS4, TS5, TS6, TS7, and TS8 after the period TS1 is the same as the arrangement order of the channels via which the data are outputted by the ADCs 110~140.

Figure 6:
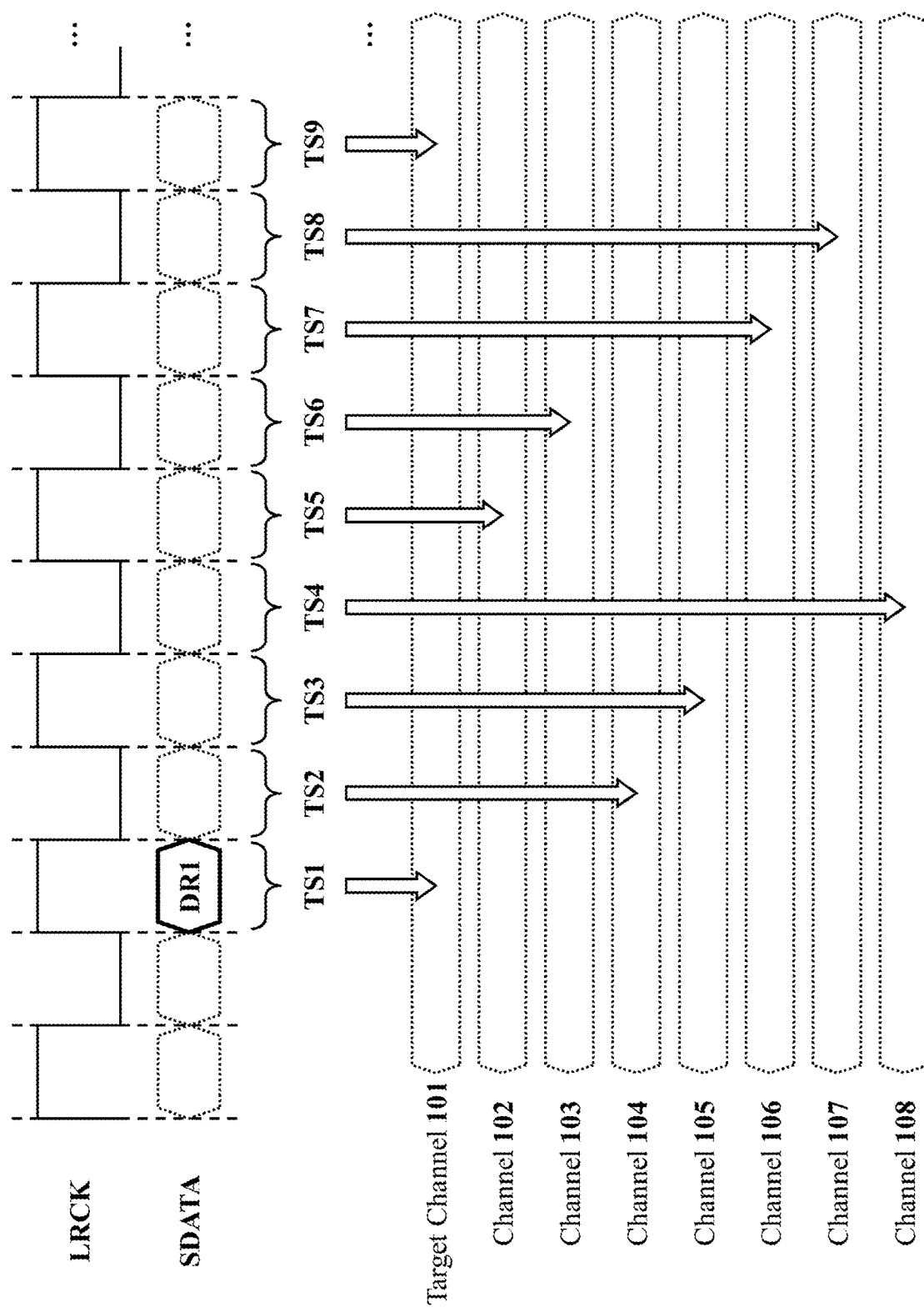
FIG. 6 shows a simplified data input timing diagram of the control chip in FIG. 1 according to another embodiment of the present disclosure.

Therefore, as shown in FIG. 6, the control chip 150 determines that the period TS2 corresponds to the second left-channel 104, the period TS3 corresponds to the third right-channel 105, the period TS4 corresponds to the fourth left-channel 108, the period TS5 corresponds to the first left-channel 102, the period TS6 corresponds to the second right-channel 103, the period TS7 corresponds to the third left-channel 106, and the period TS8 corresponds to the fourth right-channel 107. In the operation 216, the control chip 150 may respectively establish the corresponding relation between respective pulse count values of the left-right clock signal LRCK at respective initial time points of the aforementioned periods TS2~TS8 and the channels 104, 105, 108, 102, 103, 106, and 107. Applying the same analogy, the control chip 150 may determine that the arrangement order of the channels corresponding to the succeeding 8 periods after the period TS8 (i.e., the next 8 periods starting from the period TS9) is the same as the arrangement order of the channels corresponding to the aforementioned periods TS1~TS8.

Then, the control chip 150 may perform the operation 218 to utilize the control signal CTL to instruct the ADCs 110~140 to resume operation and output the audio data of corresponding channels. In this situation, the ADCs 110~140 perform the operation 220 to output the audio data of different channels in turns according to the assigned order configured by the control chip 150 so as to form the serial data signal SDATA.

In the operation 222, the control chip 150 receives the serial data signal SDATA through the serial data line 152, and separates the audio data of different channels from the serial data signal SDATA.

As can be appreciated from the aforementioned descriptions, by performing the aforementioned operations 202, 210, 214, and 216, the control chip 150 can accurately determine the data timing with respect to respective channels occurring in the serial data signal SDATA. Accordingly, the control chip 150 can accurately separate the digital audio data of different channels from the serial data signal SDATA according to the data timing of respective channels in the operation 222.

Afterwards, the control chip 150 or the circuit in the subsequent stage (not shown in FIG. 1) of the control chip 150 may further process or compare the audio data of respective channels.

Please note that the aforementioned order for performing the operations shown in FIG. 2 is merely an exemplary embodiment, rather than a restriction to the practical implementations.

Figure 7:
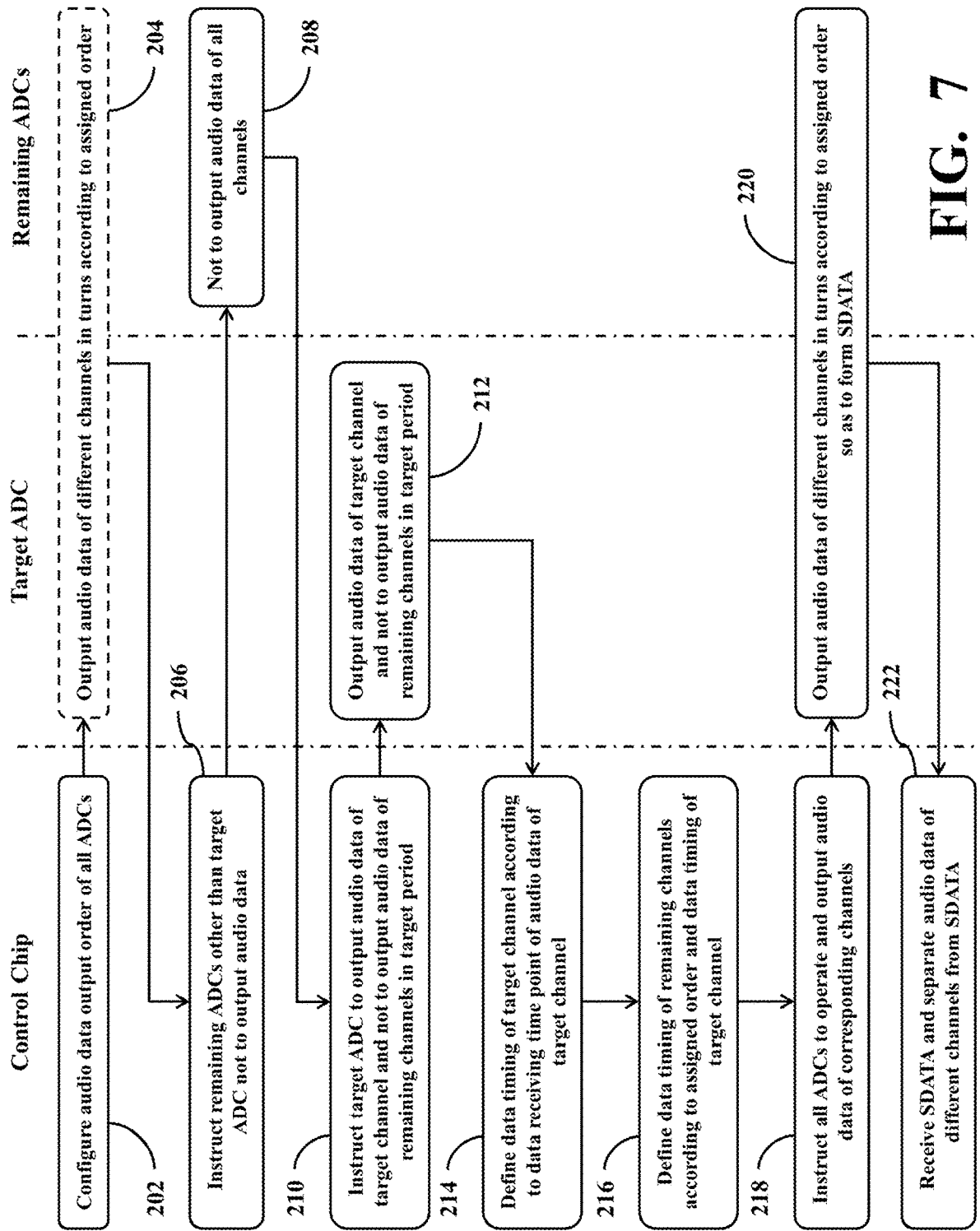
FIG. 7 shows a simplified flowchart of the multi-channel audio data separating method according to a second embodiment of the present disclosure.

For example, as shown in FIG. 7, the operation 210 may be performed after the operation 208.

For another example, the operations 202 and 204 in FIG. 2 or FIG. 7 may be performed between the operations 206 and 210.

Figure 8:
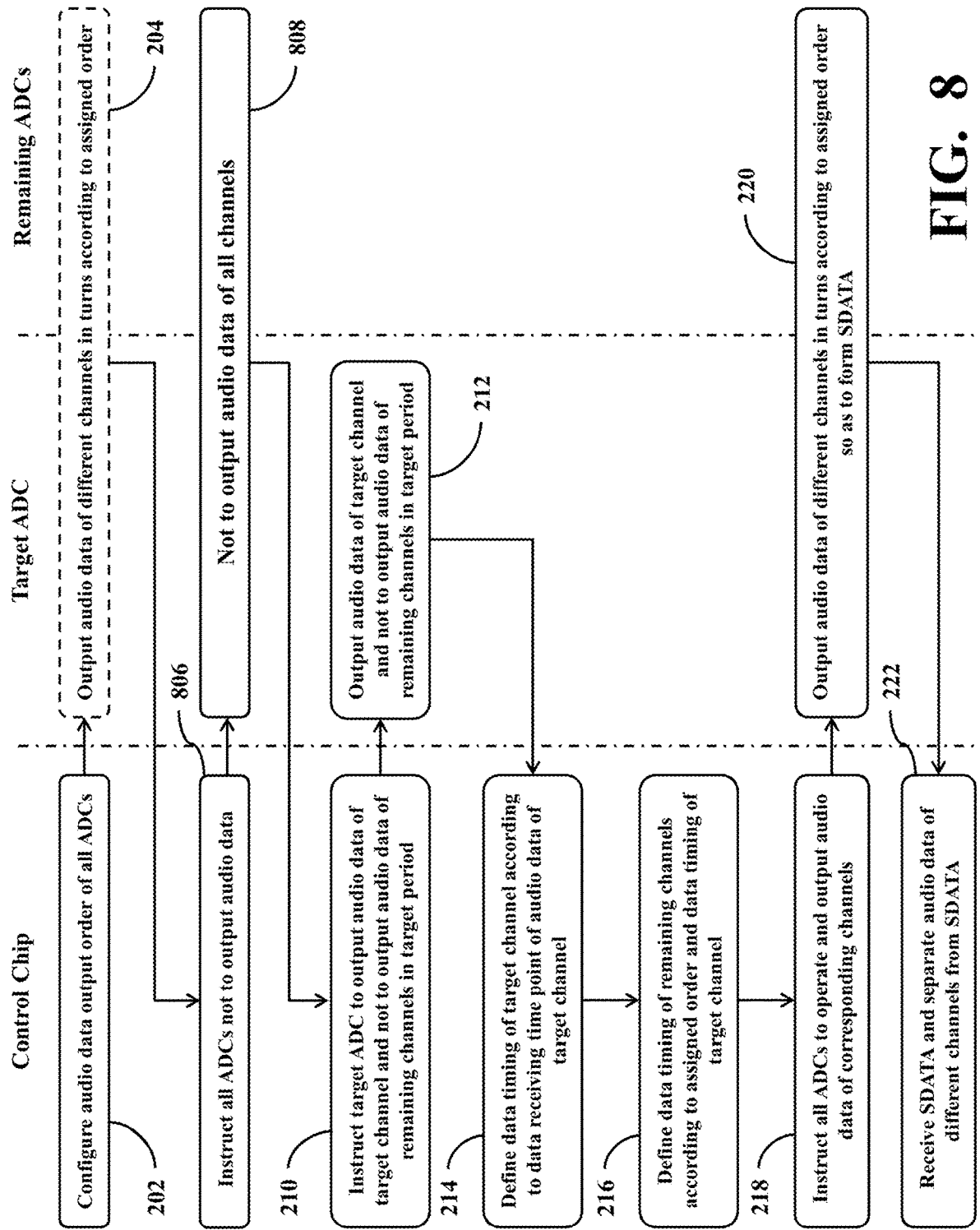
FIG. 8 shows a simplified flowchart of the multi-channel audio data separating method according to a third embodiment of the present disclosure.

In addition, as shown in FIG. 8, the aforementioned operation 206 in FIG. 2 or FIG. 7 may be replaced by the operation 806. In the embodiment of FIG. 8, the control chip 150 may perform the operation 806 prior to the operation 210 so as to utilize the control signal CTL to instruct all ADCs 110~140 not to output audio data. In this situation, all ADCs 110~140 would not output the audio data of all channels to the serial data line 152 (operation 808). Then, after the control chip 150 confirms that there is no audio data occurring in the serial data line 152, the control chip 150 may perform the aforementioned operation 210 to instruct the target ADC 110 to output the audio data of the target channel 101 and not to output the audio data of the remaining channels (e.g., the first left-channel 102 in this embodiment) in the target period.

The foregoing descriptions regarding the implementations and related advantages of other operations in FIG. 2 are also applicable to the embodiments of FIG. 7 and FIG. 8. For the sake of brevity, those descriptions will not be repeated here.

In practice, the operations 202 and 204 in FIG. 8 may be performed between the operations 806 and 210.

In some embodiments, the operation 204 in the aforementioned FIG. 2, FIG. 7, or FIG. 8 may be omitted.

In addition, the quantity of the ADCs in the audio processing circuit 100 may be reduced to 3 or 2 or be increased to a bigger number depending on the requirement of circuit design. In this situation, the dividing factor of the frequency dividing operation conducted by the frequency divider circuit 160 should be adjusted correspondingly.

From another aspect, the serial data signal SDATA formed by the digital audio data of the aforementioned channels 101~108 is also a data signal complying with the time division multiplexed (TDM) format. However, by adopting the aforementioned method shown in FIG. 2, FIG. 7, or FIG. 8, the control chip 150 is enabled to process the TDM-format input signal even if the control chip 150 is not equipped with any TDM interface or conventional multi-channel inter-IC sound (I2S) interface. As a result, the control chip 150 may be realized with a simpler circuit structure, instead of using the circuit structure which requires a TDM interface or a I2S interface.

On the other hand, adopting the aforementioned multi-channel audio data separating method also enables the control chip 150 to accurately determine the data timing and arrangement order of the digital audio data of different channels, and thus the control chip 150 is enabled to accurately separate the digital audio data of different channels from the serial data signal SDATA.

In other words, the audio processing circuit 100 is enabled to support the multi-channel input function by utilizing the cooperation of the aforementioned control chip 150, the frequency divider circuit 160, and the ADCs 110~140.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. A circuit comprising:
a plurality of analog-to-digital converters (ADCs), configured to operably convert analog audio signals of a plurality of channels into corresponding digital audio data, the plurality of ADCs including a target ADC utilized for processing an analog audio signal of a target channel in the plurality of channels; and
a control chip, coupled with the plurality of ADCs, and configured to operably control an audio data output order of the plurality of ADCs, to operably instruct the target ADC to output an audio data of the target channel during a target period, and to operably instruct remaining ADCs of the plurality of ADCs not to output audio data in the target period;
wherein the control chip is further configured to operably define a data timing of the target channel according to a data receiving time point of the audio data of the target channel, and then to operably define a data timing of remaining channels of the plurality of channels according to the data timing of the target channel;
after the control chip defines the data timing of the plurality of channels, the plurality of ADCs process the analog audio signals of the plurality of channels and output the audio data of the plurality of channels in turns according to an assigned order configured by the control chip to form a serial data signal, and the control chip separates the digital audio data of different channels from the serial data signal according to the data timing of the plurality of channels.

2. The circuit of claim 1, wherein the control chip is further configured to generate a left-right clock signal, and the circuit further comprises:
a frequency divider circuit, coupled between the control chip and each of the plurality of ADCs, and configured to operably conduct a frequency dividing operation on the left-right clock signal to generate a channel switch signal having a frequency lower than a frequency of the left-right clock signal;
wherein each of the plurality of ADCs switches, according to the channel switch signal, channels via which the audio data is to be outputted.

3. The circuit of claim 2, wherein the control chip is further configured to operably instruct the target ADC not to output audio data of another channel in the target period.

4. The circuit of claim 2, wherein the control chip is configured to operably define the data timing of the remaining channels of the plurality of channels according to the assigned order and the data timing of the target channel.

5. The circuit of claim 2, wherein the control chip is further configured to operably control the audio data output order of the plurality of ADCs before the target period, so that the plurality of ADCs output audio data of the plurality of channels in turns based on the assigned order.

6. The circuit of claim 2, wherein each of the plurality of ADCs is a two-channel analog-to-digital converter responsible for processing analog audio signals of a pair of a left-channel and a right-channel in the plurality of channels.

7. The circuit of claim 6, wherein a frequency of the channel switch signal is 1/N of a frequency of the left-right clock signal, N being a positive integer greater than 1, and is equal to a total quantity of ADCs of the plurality of ADCs.

8. The circuit of claim 2, wherein periods during which the plurality of ADCs output digital audio data do not overlap with one another.

9. The circuit of claim 2, wherein the control chip does not have a time division multiplexed interface or a multi-channel inter-IC sound interface.

* * * * *